United States Patent
Harikai et al.

(10) Patent No.: US 7,994,026 B2
(45) Date of Patent: Aug. 9, 2011

(54) PLASMA DICING APPARATUS AND METHOD OF MANUFACTURING SEMICONDUCTOR CHIPS

(75) Inventors: Atsushi Harikai, Saga (JP); Kiyoshi Arita, Fukuoka (JP); Tetsuhiro Iwai, Fukuoka (JP)

(73) Assignee: Panasonic Corporation, Osaka (JP)

( * ) Notice: Subject to any disclaimer, the term of this patent is extended or adjusted under 35 U.S.C. 154(b) by 149 days.

(21) Appl. No.: 12/523,191

(22) PCT Filed: Nov. 12, 2008

(86) PCT No.: PCT/JP2008/003271
§ 371 (c)(1),
(2), (4) Date: Jul. 15, 2009

(87) PCT Pub. No.: WO2009/063620
PCT Pub. Date: May 22, 2009

(65) Prior Publication Data
US 2010/0048001 A1    Feb. 25, 2010

(30) Foreign Application Priority Data

Nov. 16, 2007 (JP) ................................. 2007-297567
Nov. 16, 2007 (JP) ................................. 2007-297568

(51) Int. Cl.
*H01L 21/301* (2006.01)
(52) U.S. Cl. .......... 438/464; 438/14; 438/106; 438/109; 438/118; 438/460; 257/E21.214
(58) Field of Classification Search .................. None
See application file for complete search history.

(56) References Cited

U.S. PATENT DOCUMENTS

| 6,897,128 | B2 | 5/2005 | Arita |
| 2004/0102025 | A1 | 5/2004 | Arita |
| 2005/0142815 | A1 * | 6/2005 | Miyazaki et al. ............. 438/464 |
| 2005/0173065 | A1 | 8/2005 | Arita |
| 2005/0185359 | A1 | 8/2005 | Wickramanayaka et al. |

FOREIGN PATENT DOCUMENTS

| JP | 2005-191039 | 7/2005 |
| JP | 2005-235970 | 9/2005 |
| JP | 2007-116020 | 5/2007 |
| KR | 2005-0063751 | 6/2005 |

OTHER PUBLICATIONS

International Search Report issued Feb. 17, 2009 in the International (PCT) Application of which the present application is the U.S. National Stage.

* cited by examiner

*Primary Examiner* — N Drew Richards
*Assistant Examiner* — Kyoung Lee
(74) *Attorney, Agent, or Firm* — Wenderoth, Lind & Ponack, L.L.P.

(57) ABSTRACT

A plasma dicing apparatus in which a semiconductor wafer with a protective sheet stuck thereonto covering the entire circuit-forming surface and with an etching-resistant mask member stuck on the back surface opposite to the circuit-forming surface is mounted on a mounting stage; plasma etching is performed using the mask member as a mask; and the semiconductor wafer is diced into plural semiconductor chips. The plasma dicing apparatus includes a ring-shaped frame member retaining the outer circumference of the mask member extending off the outer circumference of the semiconductor wafer. The mounting stage is composed of a wafer supporting part supporting a semiconductor wafer and a frame member supporting part supporting the frame member. This facilitates carrying a semiconductor wafer into and out of the vacuum chamber.

2 Claims, 16 Drawing Sheets

PLASMA DICING APPARATUS AND METHOD OF MANUFACTURING SEMICONDUCTOR CHIPS

TECHNICAL FIELD

The present invention relates to a plasma dicing apparatus that performs plasma etching on a semiconductor wafer in a vacuum chamber and dices the semiconductor wafer into individual semiconductor chips, and to a method of manufacturing semiconductor chips.

BACKGROUND ART

A semiconductor chip implemented such as on a board of an electronic appliance is produced by dicing a semiconductor wafer partitioned by streets (dicing line), along the streets. As a method of dicing a semiconductor wafer, a mechanical method using a dicing saw is known. Besides, in recent years, plasma dicing, which is a method of cutting off by plasma etching, has been devised (patent literature 1).

In such a method of manufacturing semiconductor chips using plasma dicing, a sheet-like supporting member (protective sheet) is first stuck onto the circuit-forming surface of a semiconductor wafer so as to cover the entire circuit-forming surface, and then a mask layer (mask member) with etching resistance is formed on the surface (back surface) opposite to the circuit-forming surface. Next, laser light is irradiated on the mask layer along streets to form a mask pattern; a semiconductor wafer with the mask pattern formed on its mask layer is carried into the vacuum chamber of a plasma dicing apparatus; and then the semiconductor wafer is mounted on the stage (mounting stage) inside the vacuum chamber so that the mask layer faces upward. Then, plasma is generated in the vacuum chamber to perform plasma etching on the semiconductor wafer with the mask layer on which the mask pattern is formed as a mask; and the semiconductor wafer is diced into individual semiconductor chips.

However, a semiconductor wafer is extremely vulnerable such as to shock before being diced into individual semiconductor chips by plasma dicing, which requires careful handling when carrying the semiconductor wafer into and out of the vacuum chamber, which causes poor workability.

[Patent literature 1] Japanese Patent Unexamined Publication No. 2005-191039

SUMMARY OF THE INVENTION

The present invention provides a plasma dicing apparatus facilitating carrying a semiconductor wafer into and out of the vacuum chamber to improve workability and a method of manufacturing semiconductor chips using the plasma dicing apparatus.

A plasma dicing apparatus of the present invention includes a vacuum chamber; a mounting stage placed in the vacuum chamber; and a process gas feeder generating plasma in the vacuum chamber. A semiconductor wafer the circuit-forming surface of which has a protective sheet stuck thereto covering the entire circuit-forming surface, and the back surface of which, opposite to the circuit-forming surface, has an etching-resistant mask member stuck thereto is mounted on the mounting stage so that the mask member faces upward. Plasma etching is performed with the mask member used as a mask, and the semiconductor wafer is diced into plural semiconductor chips. The plasma dicing apparatus further includes a ring-shaped frame member retaining the outer circumference of the mask member extending off the outer circumference of the semiconductor wafer. The mounting stage is composed of a wafer supporting part supporting a semiconductor wafer through the protective sheet; and a frame member supporting part supporting a frame member, provided on the outer circumference of the wafer supporting part.

With such a structure, the outer circumference of the etching-resistant mask member stuck onto the back surface (opposite to the circuit-forming surface) of the semiconductor wafer is retained by a ring-shaped frame member. Further, the vacuum chamber is provided therein with a frame member supporting part supporting the frame member on the outer circumference of the wafer supporting part supporting the semiconductor wafer. Consequently, the semiconductor wafer can be handled in a state unified with the mask member retained by the frame member before and after the plasma dicing process in the vacuum chamber. Hence, when carrying the semiconductor wafer into and out of the vacuum chamber, the mask member retained by the frame member can be made function as a transfer carrier for the semiconductor wafer. That is, the structure facilitates carrying a semiconductor wafer into and out of the vacuum chamber to improve workability.

In the method of manufacturing semiconductor chips, of the present invention, a semiconductor wafer partitioned into plural areas by streets is diced along the streets to produce semiconductor chips. The method of manufacturing semiconductor chips includes a protective sheet sticking step covering the entire circuit-forming surface of a semiconductor wafer with a protective sheet; a thinning step grinding the back surface (opposite to the circuit-forming surface) of the semiconductor wafer with the protective sheet stuck thereonto to thin the semiconductor wafer; a masking step sticking an etching-resistant mask member onto the back surface of the semiconductor wafer ground in the thinning step; a mask pattern forming step removing a part of the mask member stuck onto the back surface of the semiconductor wafer, corresponding to a street, to form a mask pattern with the back surface of the semiconductor wafer, corresponding to the street exposed; a plasma dicing step performing plasma etching using the mask member with a mask pattern formed thereon as a mask, and dicing the semiconductor wafer into plural semiconductor chips; a die bonding sheet sticking step sticking a die bonding sheet on each back surface of the semiconductor wafer diced into each semiconductor chip, so as to step over the mask member with a part corresponding to a street removed in the mask pattern forming step after the plasma dicing step; a protective sheet removing step removing the protective sheet from the semiconductor wafer diced into each semiconductor chip after the die bonding sticking step; and an exfoliating step exfoliating each semiconductor chip with the protective sheet removed from the mask member stuck onto the die bonding sheet. At least after the masking step to the die bonding sheet sticking step, the outer circumference of the mask member, extending off the outer circumference of the semiconductor wafer is retained by the ring-shaped frame member, and the mask member retained by the frame member is used as a transfer carrier for the semiconductor wafer and the diced semiconductor chips.

With such a structure, a semiconductor wafer stays in a state of the mask member retained by the frame member stuck at least after the masking step to the die bonding sheet sticking step. Further, the mask member retained by the frame member is used as a transfer carrier for the semiconductor wafer and the semiconductor chips diced in the plasma dicing step. As a result, a semiconductor wafer can be handled very easily between each step. Here, the mask member is attached to the back surface of a semiconductor wafer after the semiconductor wafer undergoes the thinning step. Hence, the frame member does not interfere with a grinding tool as before, allowing an existing facility to be used in the thinning step.

REFERENCE MARKS IN THE DRAWINGS

Figure 1:
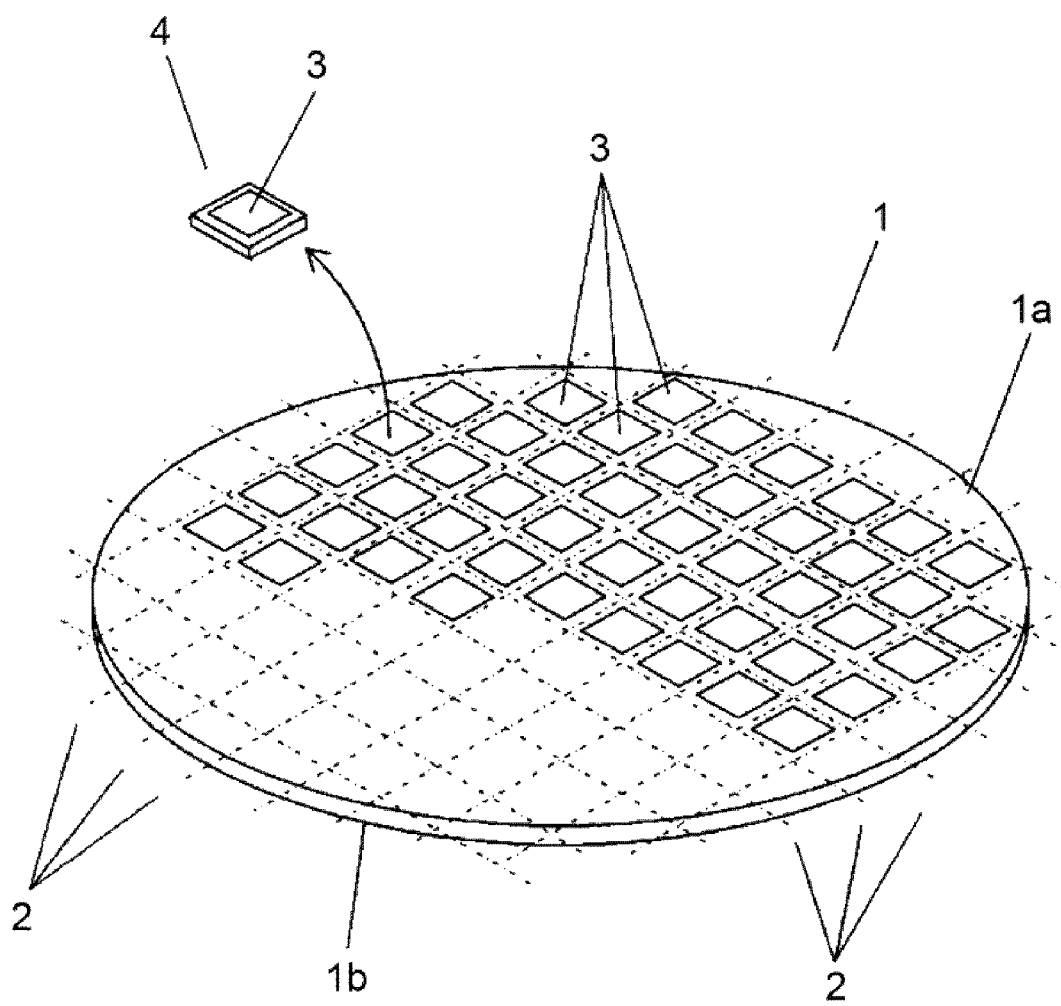
FIG. 1 is a perspective view of a semiconductor wafer used in an exemplary embodiment of the present invention.

1 Semiconductor wafer
1a Circuit-forming surface
1b Back surface
2 Street
3 Integrated circuit
4 Semiconductor chip
5 Protective sheet
6 Grinding apparatus
7 Rotating surface plate
8 Grinding tool
10 Frame-member-containing semiconductor wafer
11 Die attach film
12 Mask member
12a Removal surface
12b Asperity
12c Residue
14 Frame member
16 Boundary groove
17 Die bonding sheet
20 Laser processing apparatus
21 Wafer fixing stage
22 Laser irradiation device
23 Infrared camera
25 Control unit
30 Plasma dicing apparatus
31 Vacuum chamber
32 Stage
34 Wafer gateway
35 Gate
36 Controller
37 Gate open/close drive part
38 Wafer supporting part
39 Frame member supporting part
42 Wafer retention mechanism
43 High-frequency power supply unit
44 Cooling unit
45 Upper electrode
46 Process gas feeder
47 Vacuum outlet
48 Vacuum exhausting part 49 Porous plate
51 Elevating cylinder (elevating mechanism)
52 Piston rod
53 Cover member elevation drive part
54 Cover member
55 Opening
56 Flange
57 Connecting projection
58 Connecting hole
60 Vacuum transfer tool
61 Holding part
62 Suction part
63 Wafer retention part

DETAILED DESCRIPTION OF PREFERRED
EMBODIMENT

Hereinafter, a description is made of an exemplary embodiment of a plasma dicing apparatus and a method of manufacturing semiconductor chips by means of the plasma dicing apparatus, of the present invention, in reference to related drawings.

FIG. 1 is a perspective view showing a semiconductor wafer used in an embodiment of the present invention. In FIG. 1, circuit-forming surface 1a on the top surface of semiconductor wafer 1 is partitioned into plural areas by lattice-shaped streets (dicing line) 2, and each area partitioned has semiconductor element (integrated circuit) 3 formed thereon. Accordingly, semiconductor wafer 1, if diced along street 2, produces a large number of semiconductor chips 4 collectively. The method of manufacturing semiconductor chips by means of a plasma dicing apparatus according to the embodiment produces semiconductor chips 4 from semiconductor wafer 1 shown in FIG. 1.

Figure 2:
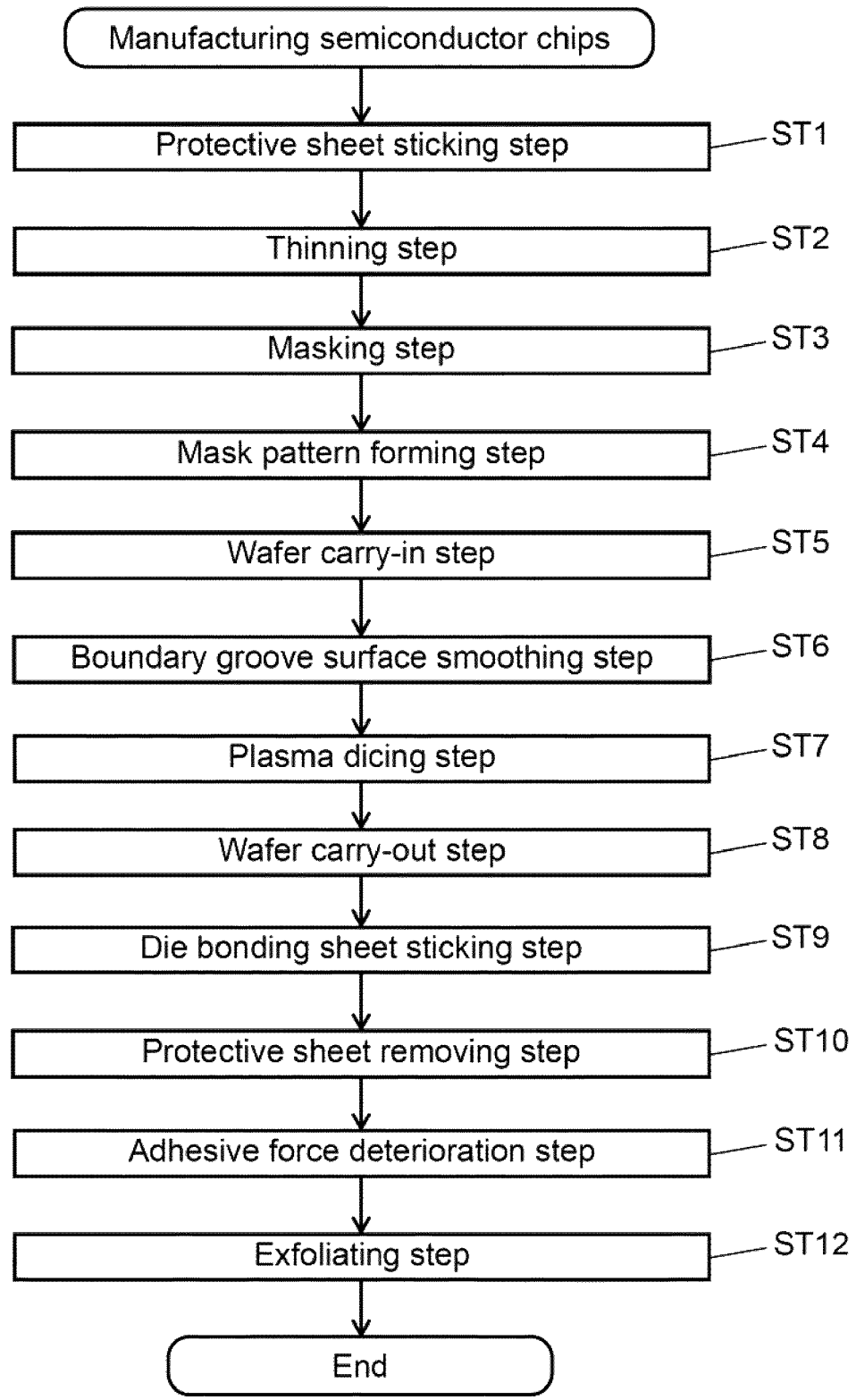
FIG. 2 is a flowchart illustrating a method of manufacturing semiconductor chips, according to the embodiment.

FIG. 2 is a flowchart showing the method of manufacturing semiconductor chips by the plasma dicing apparatus of the embodiment. A description is made of an outline method of manufacturing semiconductor chips by the plasma dicing apparatus of the embodiment in reference to FIG. 2.

Protective sheet sticking step ST1 is a step of sticking adhesive protective sheet 5 (refer to FIG. 3A) onto circuit-forming surface 1a of semiconductor wafer 1. Thinning step ST2 is a step of thinning semiconductor wafer 1 with protective sheet 5 stuck thereonto. Masking step ST3 is a step of sticking mask member 12 (refer to FIG. 4A) onto the back surface of semiconductor wafer 1. Mask pattern forming step ST4 is a step of forming a mask pattern along streets 2 on the surface of mask member 12.

Figure 7:
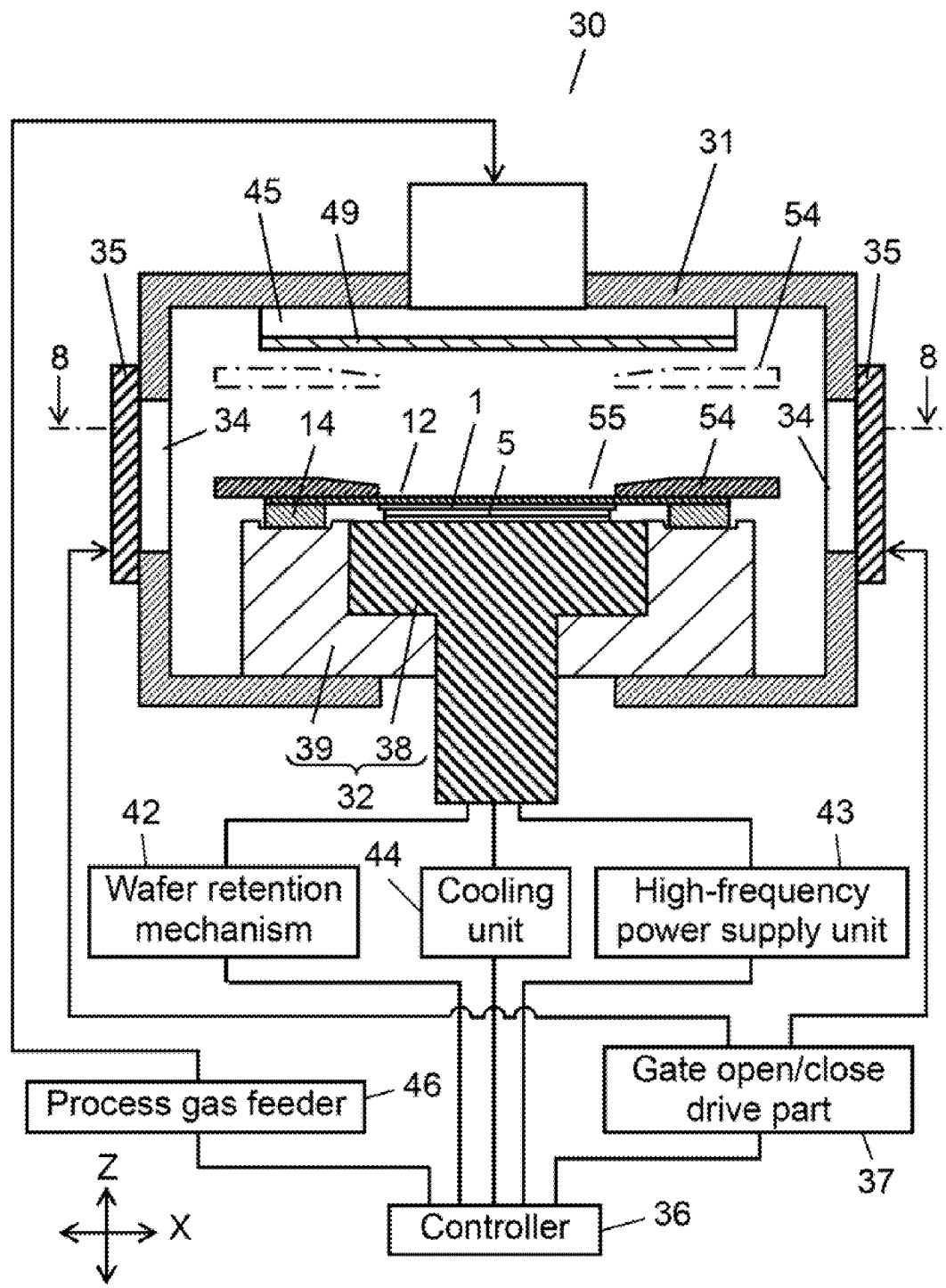
FIG. 7 is a sectional elevational view of the laser processing apparatus according to the embodiment.

Wafer carry-in step ST5 is a step of carrying semiconductor wafer 1 into vacuum chamber 31 (refer to FIG. 7) of plasma dicing apparatus 30 (refer to FIG. 7). Boundary groove surface smoothing step ST6 is a step of smoothing a surface of boundary groove 16 (refer to FIG. 4B) of mask member 12 formed in mask pattern forming step ST4. Plasma dicing step ST7 is a step of forming semiconductor chip 4 by cutting semiconductor wafer 1 along the mask pattern. Wafer carry-out step ST8 is a step of carrying semiconductor chips 4 divided out of the inside of vacuum chamber 31 of plasma dicing apparatus 30.

Die bonding sheet sticking step ST9 is a step of sticking die bonding sheet 17 (refer to FIG. 17A) onto the surface of mask member 12. Protective sheet removing step ST10 is a step of removing protective sheet 5 formed on semiconductor wafer 1. Adhesive force deterioration step ST11 is a step of deteriorating the adhesive force of mask member 12. Exfoliating step ST12 is a step of exfoliating semiconductor chip 4 off from die bonding sheet 17. The above-described steps produce semiconductor chips 4.

Figure 3A:
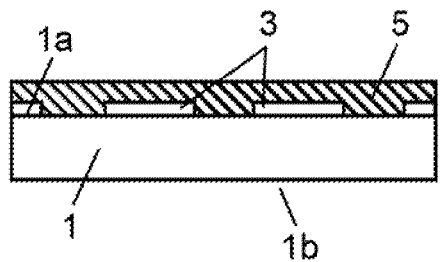
FIG. 3A is a manufacturing process sectional view showing the method of manufacturing semiconductor chips, according to the embodiment.
Figure 3B:
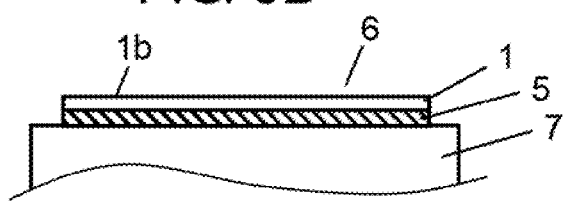
FIG. 3B is a manufacturing process sectional view showing the method of manufacturing semiconductor chips, according to the embodiment.

Hereinafter, a description is made of the method of manufacturing semiconductor chips by means of a plasma dicing apparatus of the embodiment according to the steps in FIG. 2 with reference to the related drawings. FIGS. 3A through 3D are manufacturing process sectional views illustrating protective sheet sticking step ST1 and thinning step ST2 of the embodiment. FIGS. 4A through 4C are manufacturing process sectional views illustrating masking step ST3 and mask pattern forming step ST4 of the embodiment.

(Protective Sheet Sticking Step ST1)

First, protective sheet sticking step ST1 is executed. In this step, as shown in FIG. 3A, an adhesive, sheet-like protective sheet (e.g. UV tape) 5 is stuck onto circuit-forming surface 1a of semiconductor wafer 1. Protective sheet 5 is shaped in the same outside shape as that of semiconductor wafer 1 to cover the entire circuit-forming surface 1a of semiconductor wafer 1. In protective sheet sticking step ST1, protective sheet 5 preliminarily shaped in the same size as semiconductor wafer 1 may be stuck onto circuit-forming surface 1a of semiconductor wafer 1. Alternatively, after protective sheet 5 larger than semiconductor wafer 1 is stuck onto circuit-forming surface 1a of semiconductor wafer 1, protective sheet 5 may be cut off (shaping) along the outside shape of semiconductor wafer 1.

(Thinning Step ST2)

After protective sheet sticking step ST1 ends, thinning step (back surface grinding step) ST2 is executed subsequently. In this step, as shown in FIG. 3B, semiconductor wafer 1 with protective sheet 5 stuck thereonto is first placed on rotating surface plate 7 of grinding apparatus 6. Here, the surface on which protective sheet 5 of semiconductor wafer 1 is stuck is fixed onto the top surface of rotating surface plate 7. That is, the surface (referred to as back surface 1b hereinafter) opposite to circuit-forming surface 1a is made face upward.

Figure 3C:
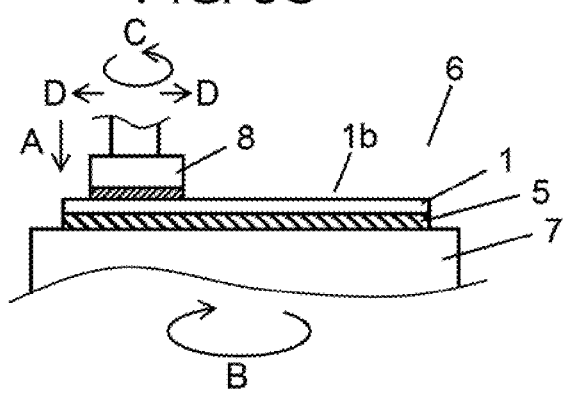
FIG. 3C is a manufacturing process sectional view showing the method of manufacturing semiconductor chips, according to the embodiment.
Figure 3D:
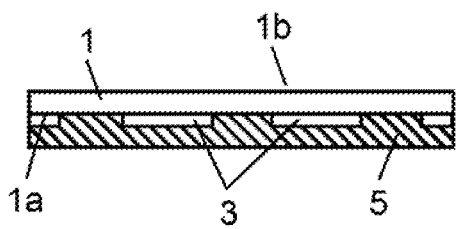
FIG. 3D is a manufacturing process sectional view showing the method of manufacturing semiconductor chips, according to the embodiment.
Figure 4A:
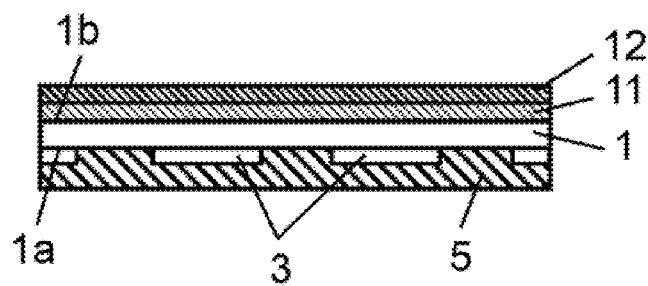
FIG. 4A is a manufacturing process sectional view showing the method of manufacturing semiconductor chips, according to the embodiment.
Figure 4B:
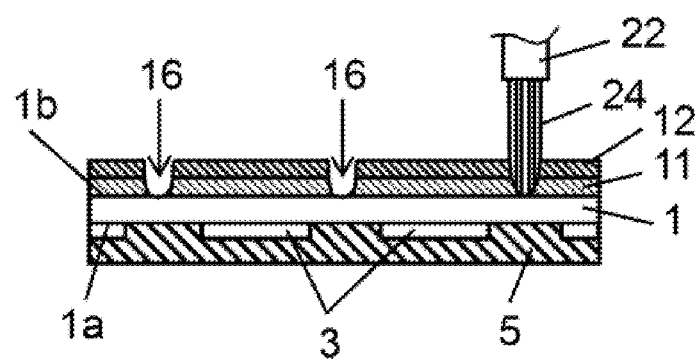
FIG. 4B is a manufacturing process sectional view showing the method of manufacturing semiconductor chips, according to the embodiment.
Figure 4C:
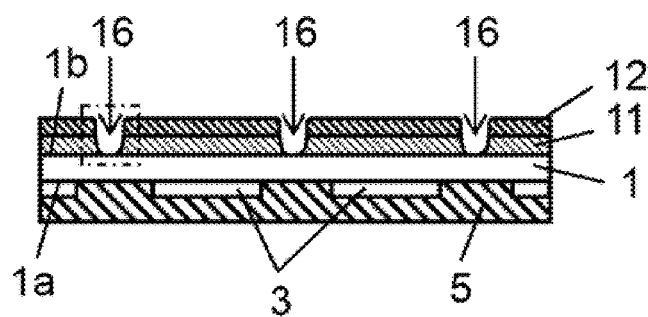
FIG. 4C is a manufacturing process sectional view showing the method of manufacturing semiconductor chips, according to the embodiment.

After semiconductor wafer 1 is placed on rotating surface plate 7, as shown in FIG. 3C, back surface 1b of semiconductor wafer 1 is ground by grinding tool 8 placed above rotating surface plate 7, in which case grinding tool 8 is pressed against back surface 1b of semiconductor wafer 1 (arrow A shown in FIG. 3C). Further, rotating surface plate 7 and grinding tool 8 are rotated on the vertical shaft (arrows B, C in FIG. 3C). Further, grinding tool 8 is made swing on the horizontal surface (arrow D shown in FIG. 3C). With thinning step ST2, as shown in FIG. 3D, semiconductor wafer 1 is thinned to a thickness of approximately 100 to 30 μm. Here, thinning step ST2 may include a stress relief process removing a damaged layer generated on back surface 1b of semiconductor wafer 1 by grinding tool 8.

(Masking Step ST3)

After thinning step ST2 ends, masking step ST3 is executed. In this step, as shown in FIG. 4A, an etching-resistant, film-like mask member (UV tape, here) is stuck onto back surface 1b of semiconductor wafer 1 ground in thinning step ST2 through die attach film 11 (so as to sandwich die attach film 11 therebetween). Here, die attach film 11 functions as a bonding film layer for die-bonding each semiconductor chip 4 (for bonding each semiconductor chip 4 such as onto a board).

Figure 5A:
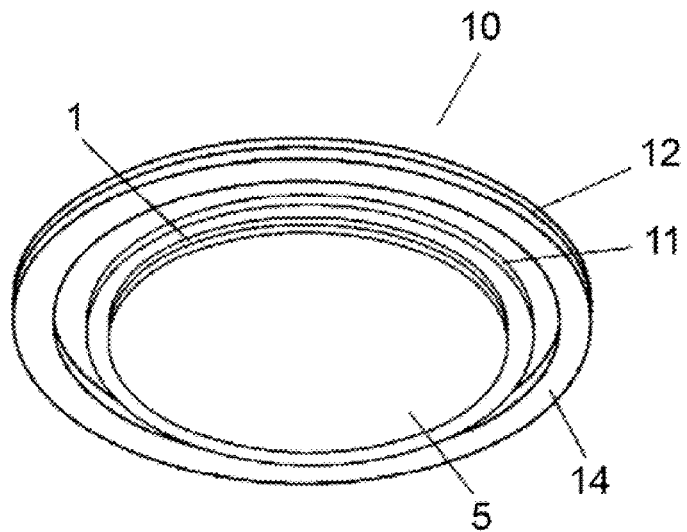
FIG. 5A is a perspective view showing a frame-member-containing semiconductor wafer according to the embodiment.
Figure 5B:
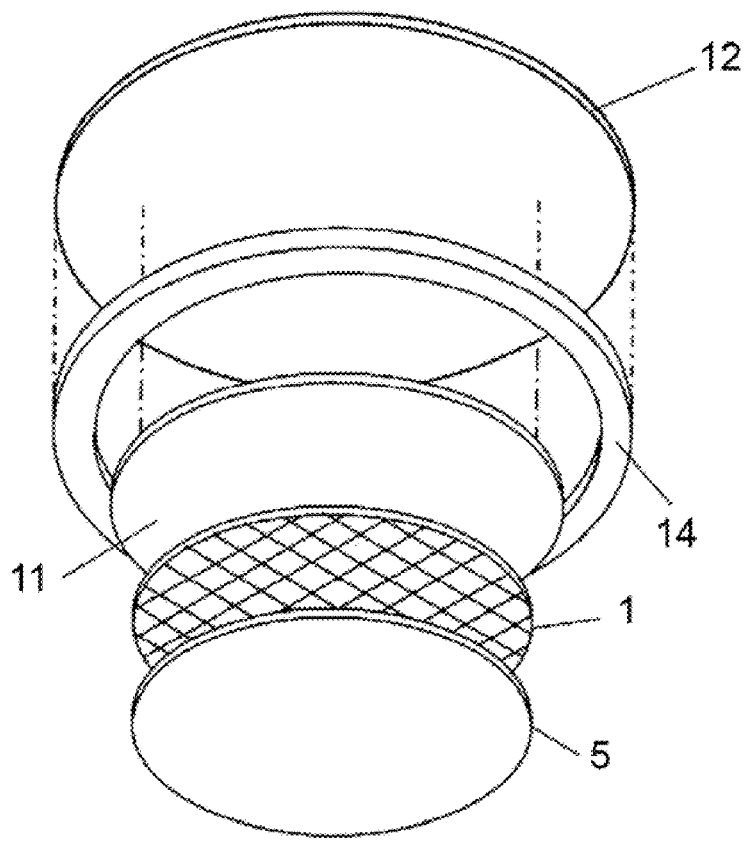
FIG. 5B is an exploded perspective view showing the frame-member-containing semiconductor wafer according to the embodiment.

FIG. 5A is a perspective view of a semiconductor wafer including a frame member, according to the embodiment. FIG. 5B is an exploded perspective view of the semiconductor wafer. As shown in FIGS. 5A, 5B, die attach film 11 has an external diameter roughly the same (slightly larger) as that of semiconductor wafer 1. Mask member 12 has an external diameter large enough to extend off the outer circumference of semiconductor wafer 1. The outer circumference of mask member 12, extending off the outer circumference of semiconductor wafer 1, has metal (e.g. stainless-steel), ring-shaped frame member 14 stuck thereonto. That is, the outer circumference of mask member 12 stuck onto back surface 1*b* of semiconductor wafer 1 is in a state retained by ring-shaped frame member 14. In this embodiment, frame member 14 is round ring-shaped, but it may be polygonal ring-shaped. Hereinafter, semiconductor wafer 1 in a state where the outer circumference of mask member 12 retained by frame member 14 is stuck onto back surface 1*b* of semiconductor wafer 1 is referred to as frame-member-containing semiconductor wafer 10.

(Mask Pattern Forming Step ST4)

After masking step ST3 ends, mask pattern forming step ST4 is executed. In this step, frame-member-containing semiconductor wafer 10 is first placed on laser processing apparatus 20 shown in FIG. 6.

Figure 6:
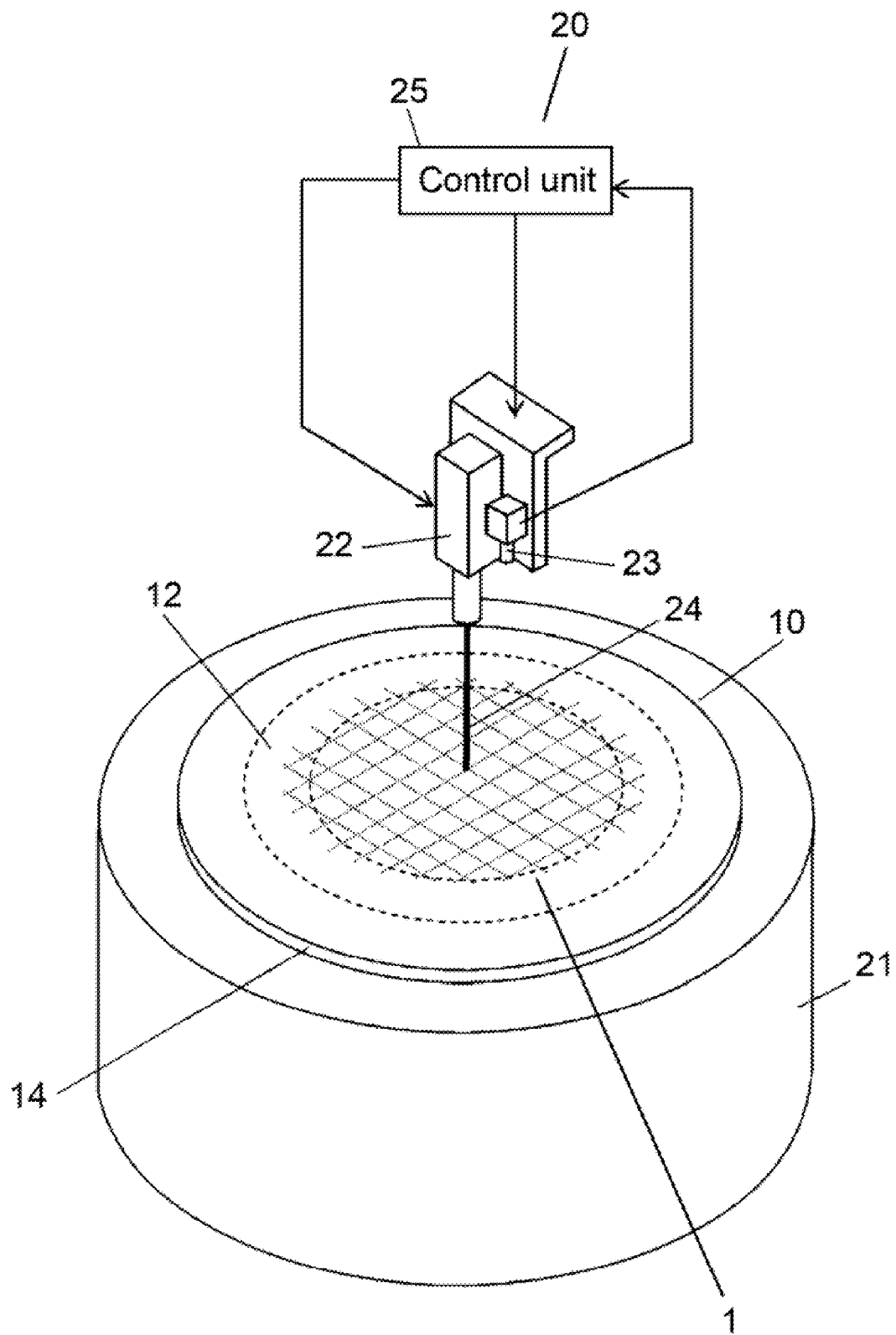
FIG. 6 is a block diagram of a laser processing apparatus according to the embodiment.

FIG. 6 is a block diagram of a laser processing apparatus according to the embodiment. In FIG. 6, laser processing apparatus 20 includes wafer fixing part 21 fixing frame-member-containing semiconductor wafer 10 in a horizontal posture such as by means of a vacuum chuck mechanism (not shown). Laser processing apparatus 20 further includes laser irradiating apparatus 22 provided movably three-dimensionally above wafer fixing part 21. Laser processing apparatus 20 still further includes infrared camera 23 moving integrally with laser irradiating apparatus 22 with its imaging area facing downward. Laser processing apparatus 20 yet further includes control unit 25 controlling movement of laser irradiating apparatus 22, irradiation of laser light 24 from laser irradiating apparatus 22, and imaging operation of infrared camera 23. Infrared camera 23 images such as semiconductor element 3, street 2, and recognition marks on circuit-forming surface 1*a* from back surface 1*b* of semiconductor wafer 1.

Frame-member-containing semiconductor wafer 10 is fixed to wafer fixing part 21 so that mask member 12 stuck onto back surface 1*b* of semiconductor wafer 1 faces upward. Here, to fix semiconductor wafer 1 (frame-member-containing semiconductor wafer 10) having undergone masking step ST3 to wafer fixing part 21, frame member 14 has only to be held and moved. Mask member 12 held by frame member 14 functions as a transfer carrier for semiconductor wafer 1.

After frame-member-containing semiconductor wafer 10 is fixed to wafer fixing part 21, control unit 25 of laser processing apparatus 20 irradiates laser light 24 along streets 2 in semiconductor wafer 1 as shown in FIG. 4B. That is, control unit 25 controls movement of laser irradiating apparatus 22 and irradiation of laser light 24 from laser irradiating apparatus 22 according to image information on semiconductor wafer 1 transmitted from infrared camera 23; and according to position information on streets 2 and recognition marks preliminarily stored in storage (not shown). Herewith, as shown in FIG. 4C, parts of semiconductor wafer 1 corresponding to mask member 12; and parts of die attach film 11 corresponding to street 2 are removed. That is, a mask pattern is formed from plural lattice-shaped boundary grooves 16 on the front surface of mask member 12, and back surface 1*b* of semiconductor wafer 1 corresponding to streets 2 is exposed from boundary grooves 16. Herewith, mask member 12 and die attach film 11 become a state divided into areas each corresponding to each semiconductor chip 4.

(Wafer Carry-In Step ST5)

After mask pattern forming step ST4 ends, wafer carry-in step ST5 is executed. In this step, semiconductor wafer 1 including a frame member is removed from wafer fixing part 21 of laser processing apparatus 20, and it is carried into vacuum chamber 31 of plasma dicing apparatus 30 described later.

Figure 8:
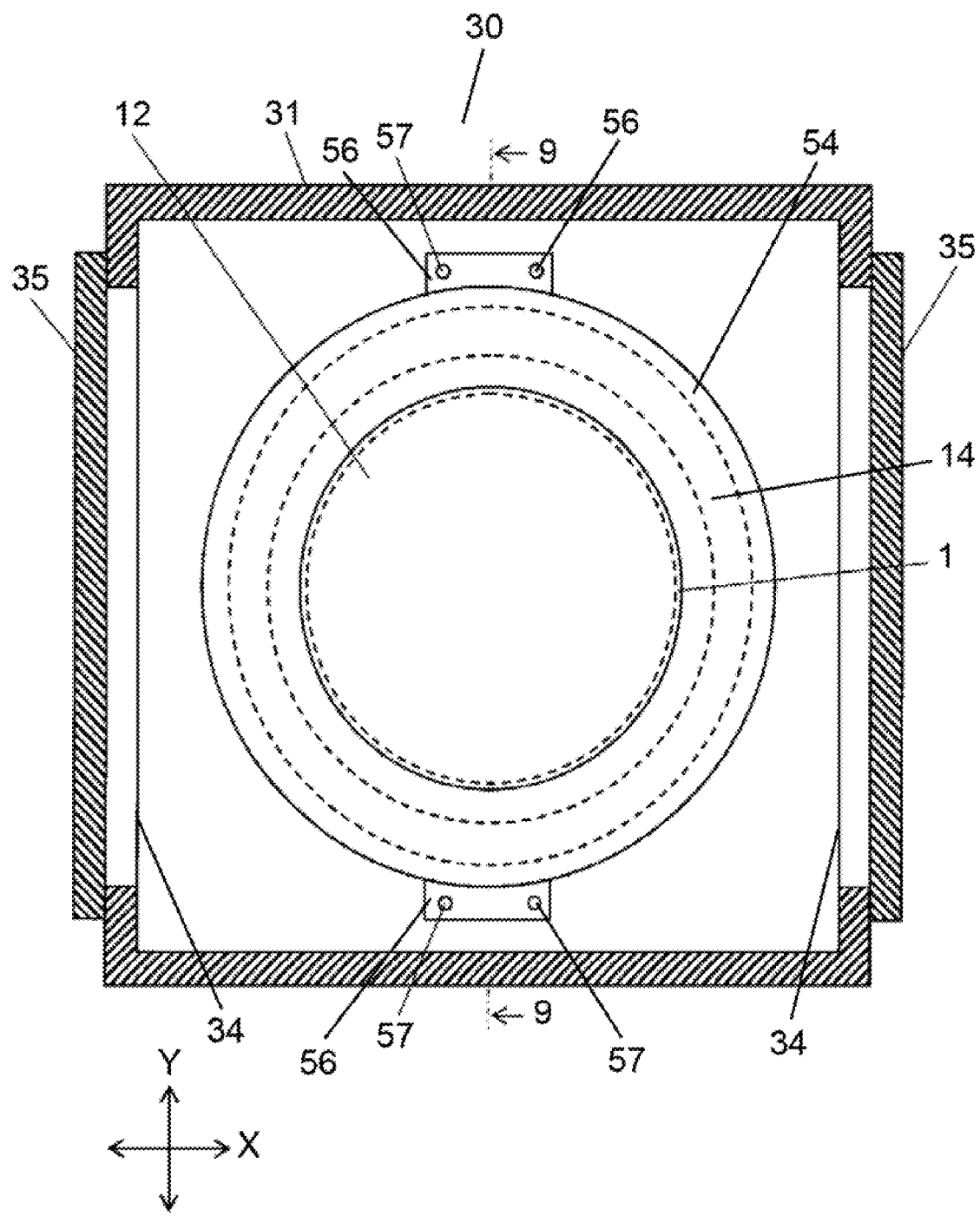
FIG. 8 is a sectional plan view of the plasma dicing apparatus, taken along line 8-8 in FIG. 7.
Figure 9:
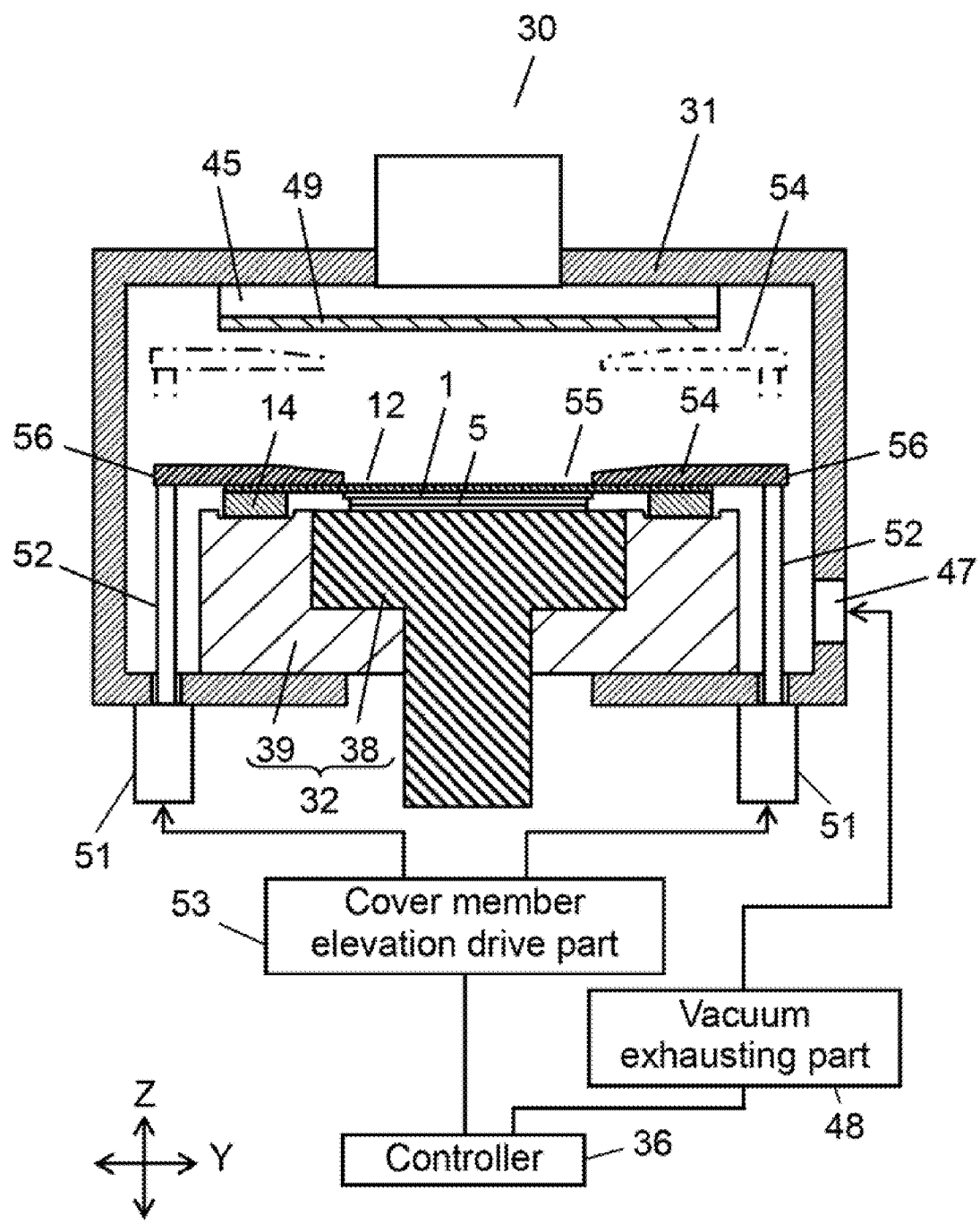
FIG. 9 is a sectional side view of the plasma dicing apparatus, taken along line 9-9 in FIG. 8.
Figure 10:
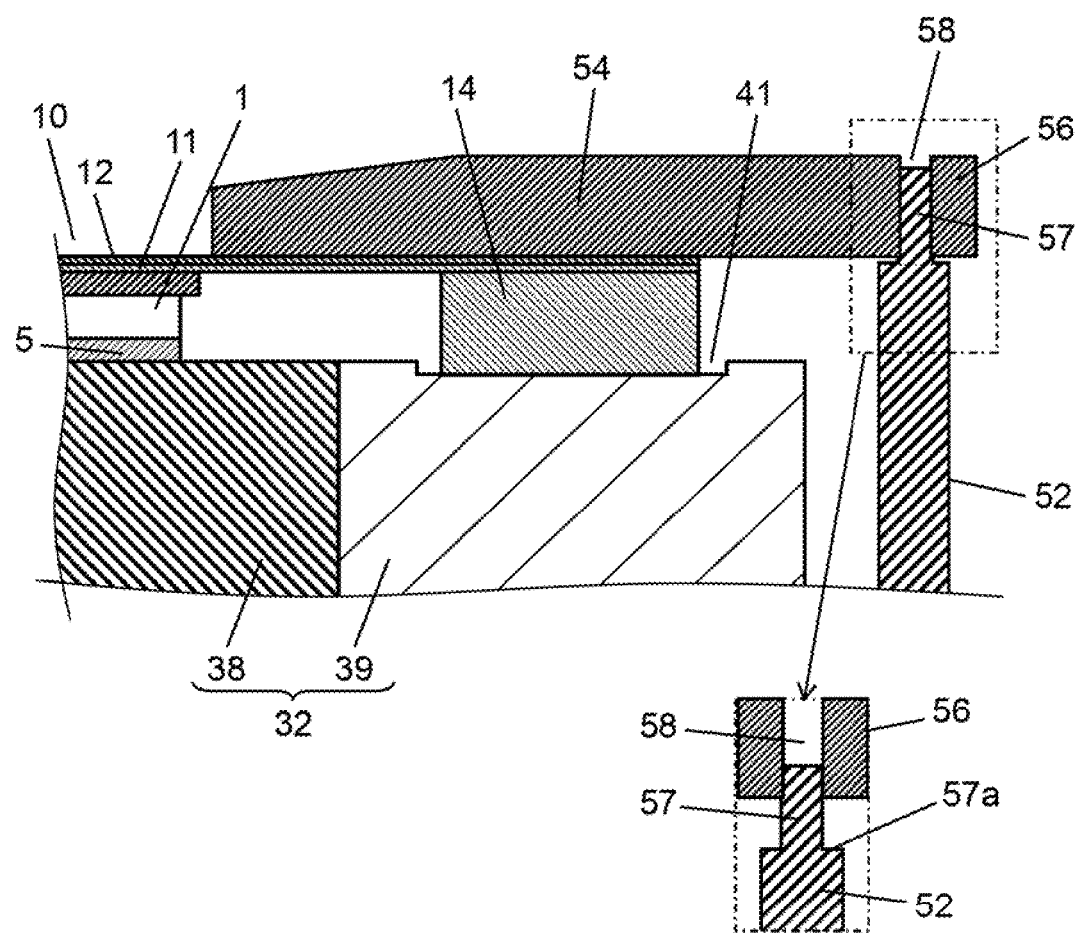
FIG. 10 is an enlarged partial sectional side view of the plasma dicing apparatus.

Here, a description is made of the configuration of plasma dicing apparatus 30, with reference to FIGS. 7, 8, 9, 10. FIG. 7 is a sectional elevational view of a plasma dicing apparatus according to the embodiment. FIG. 8 is a sectional plan view of the plasma dicing apparatus, taken along line 8-8 in FIG. 7. FIG. 9 is a sectional side view of the plasma dicing apparatus, taken along line 9-9 in FIG. 8. FIG. 10 is an enlarged partial sectional side view of the plasma dicing apparatus.

In FIGS. 7 through 10, plasma dicing apparatus 30 includes vacuum chamber 31 and stage 32 as a mounting stage placed inside vacuum chamber 31. On stage 32, frame-member-containing semiconductor wafer 10 is placed with mask member 12 facing upward. In FIGS. 7, 8, vacuum chamber 31 is provided with two wafer gateways 34 for carrying frame-member-containing semiconductor wafer 10 into and out of vacuum chamber 31. Gates 35 are placed at the positions where two wafer gateways 34 are opened and closed, of each wafer gateway 34. These two gates 35 moves up and down relative to vacuum chamber 31 through gate open/close drive part 37 with its operation controlled by controller 36, to open/close wafer gateway 34.

Stage 32 is composed of wafer supporting part 38 (i.e. lower electrode) and frame member supporting part 39 placed on the outer circumference of wafer supporting part 38. The top surfaces of wafer supporting part 38 and frame member supporting part 39 are both flat and have roughly the same height. Wafer supporting part 38 has an outside shape larger than that of frame-member-containing semiconductor wafer 10. In a state where frame-member-containing semiconductor wafer 10 is mounted on stage 32 so that the center of frame-containing semiconductor wafer 10 (center of semiconductor wafer 1) nearly conforms vertically to the center of stage 32 (center of wafer supporting part 38), semiconductor wafer 1 stays within the top area of supporting part 38 as shown in FIG. 7. Frame member 14 stays within the area of frame member supporting part 39.

In FIG. 10, the top surface of frame member supporting part 39 is provided thereon with ring-shaped groove 41. Groove 41 is provided at a position and in size so that frame member 14 of frame-member-containing semiconductor wafer 10 can be fitted into from above when frame-member-containing semiconductor wafer 10 is mounted on stage 32 so that the center of frame-member-containing semiconductor wafer 10 (center of semiconductor wafer 1) nearly conforms vertically to the center of stage 32 (center of wafer supporting part 38).

Wafer supporting part 38 is provided with wafer retention mechanism 42 (FIG. 7). Wafer retention mechanism 42 is composed of a vacuum chuck, electrostatic suction mechanism, and others, and its operation is controlled by controller 36. Wafer retention mechanism 42 retains semiconductor wafer 1 on wafer supporting part 38 according to operation control by controller 36 through protective sheet 5 stuck onto circuit-forming surface 1*a* of semiconductor wafer 1. Wafer supporting part 38 is connected to high-frequency power supply unit 43 and cooling unit 44 (FIG. 7). High-frequency power supply unit 43 applies a high-frequency voltage to wafer supporting part 38 as a lower electrode according to operation control by controller 36. Cooling unit 44 circulates a refrigerant in wafer supporting part 38 according to operation control by controller 36.

In FIG. 9, the upper position of wafer supporting part 38 inside vacuum chamber 31 is provided thereon with upper electrode 45. Upper electrode 45 has process gas feeder 46 connected thereto feeding the inside of vacuum chamber 31 with a process gas such as oxygen-containing gas and fluorine-containing gas required in boundary groove surface smoothing step ST6 and plasma dicing step ST7 (described later). Process gas feeder 46 feeds the inside of vacuum chamber 31 with a process gas via upper electrode 45 according to operation control by controller 36. The lower part of vacuum chamber 31 is provided therein with vacuum outlet 47 (FIG. 9), to which vacuum exhausting part 48 is connected. Vacuum exhausting part 48 sucks and exhausts air inside vacuum chamber 31 to make the inside of hermetically-sealed chamber 31 in a vacuum state according to operation control by controller 36.

The bottom surface of upper electrode 45 is provided thereon with porous plate 49. A process gas fed from process gas feeder 46 into upper electrode 45 passes through porous plate 49 and is sprayed uniformly on frame-member-containing semiconductor wafer 10 retained on stage 32.

In FIG. 9, vacuum chamber 31 is provided thereon with a pair of elevating cylinders 51 arranged in the direction (X-axis direction) facing two wafer gateways 34 and in the horizontal direction (Y-axis direction) orthogonal to two wafer gateways 34. The tip of piston rod 52 of each elevating cylinder 51 points upward, and each piston rod 52 is provided so as to vertically extend in vacuum chamber 31. These pair of elevating cylinders 51 operates through cover member elevation drive part 53 with its operation controlled by controller 36 to vertically protrude and retreat piston rods 52 synchronously with each other.

Cover member 54 made of a dielectric substance (e.g. ceramic) is placed above frame member supporting part 39 of stage 32. Cover member 54 is ring-shaped with round opening 55 formed at the central part of cover member 54. Cover member 54 is formed in shape and size so as to cover the entire top surface of frame member 14 in a state where semiconductor wafer 1 is positioned in the area of opening 55 when cover member 54 is stacked over frame-member-containing semiconductor wafer 10.

In FIGS. 8, 9, 10, a pair of flanges 56 are placed at a position facing the Y-axis direction of the outer circumference of cover member 54. Each flange 56 is connected to the front end (top end) of piston rod 52 of elevating cylinder 51 arranged directly beneath the flange 56. When the pair of elevating cylinders 51 synchronously protrude and retreat piston rods 52 vertically, cover member 54 moves up and down above frame member supporting part 39 of stage 32 while retaining a horizontal posture.

Cover member 54 is positioned at the move-up position directly below upper electrode 45 as shown by the dashed-dotted lines in FIGS. 7, 9 in a state where piston rods 52 of both elevating cylinders 51 have been moved up to the maximum protruded position. Meanwhile, cover member 54 is positioned at the frame member touching position (i.e. touching frame member 14 of frame-member-containing semiconductor wafer 10 from the above) in a state where piston rods 52 of both elevating cylinders 51 have been moved down to the maximum retreated position.

As shown in FIGS. 10, 8, the tip of piston rod 52 has plural connecting projections 57 formed protruding and extending upward. Flange 56 of cover member 54 has plural connecting holes 58 formed piercing flange 56 vertically. The tip of piston rod 52 of elevating cylinder 51 is connected to flange 56 of cover member 54 with plural connecting projections 57 inserted into plural connecting holes 58 from below. With touching surface 57a (FIG. 10) at the basal portion of connecting projection 57 touching the bottom surface of flange 56 from below, the tip of piston rod 52 is connected to flange 56 of cover member 54. Accordingly, when cover member 54 touches frame-member-containing semiconductor wafer 10 from above in the process of piston rod 52 moving down from the maximum protruded position to the maximum retreated position, cover member 54 stops at the position touched (frame member touching position). After that, however, touching surface 57a of piston rod 52 departs downward from the bottom surface of flange 56, disconnecting cover member 64 from piston rod 52, and piston rod 52 moves down to the maximum retreated position directly. At this moment, connecting projection 57 of piston rod 52 moves down inside connecting hole 58 of flange 56.

Here, both elevating cylinders 51 are placed where connecting projection 57 of piston rod 52 does not slip downward through connecting hole 58 of flange 56, even when cover member 54 while moving down touches frame member 14 of frame-member-containing semiconductor wafer 10 and piston rod 52 moves down to the maximum retreated position directly. Hence, when piston rods 52 of both elevating cylinders 51 move up from the maximum retreated position, touching surface 57a of piston rod 52 touches the bottom surface of flange 56 from below halfway through the movement, and cover member 54 is lifted by piston rods 52 to move up.

Figure 11A:
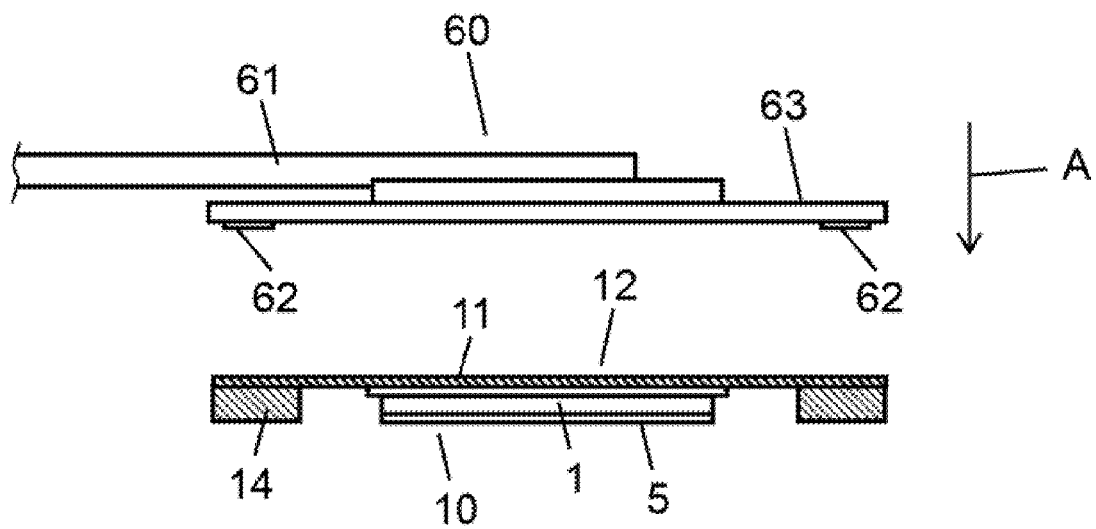
FIG. 11A shows a suction conveying tool used in the embodiment.
Figure 11B:
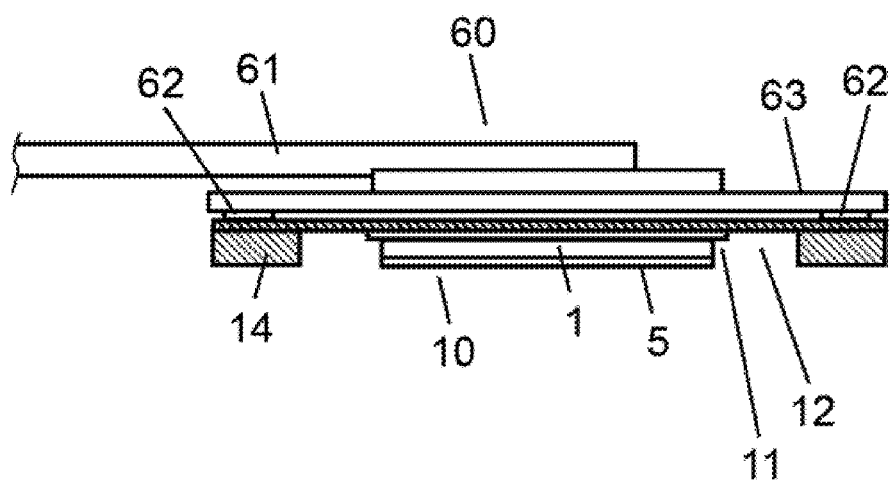
FIG. 11B shows the suction conveying tool used in the embodiment.

To carry frame-member-containing semiconductor wafer 10 into and out of the inside of vacuum chamber 31, suction conveying tool 60 as shown in FIGS. 11A, 11B is used. FIGS. 11A, 11B illustrate suction conveying tool 60 used in this embodiment. In FIGS. 11A, 11B, suction conveying tool 60 includes holding part 61 held by an operator or a wafer carry-in and carry-out apparatus separately provided; and disk-like wafer retention part 63 placed at the tip of holding part 61. Wafer retention part 63 has plural suction parts 62 on its bottom surface. Wafer retention part 63 is large enough to contain frame member 14 of frame-member-containing semiconductor wafer 10. Plural suction parts 62 are linked to a vacuum source (neither vacuum pipe line nor vacuum source are shown) through vacuum pipe lines extending in wafer retention part 63 and holding part 61, respectively.

Frame-member-containing semiconductor wafer 10 is mounted on a flat surface so that circuit-forming surface 1a (i.e. protective sheet 5) of semiconductor wafer 1 faces downward. From the above, as shown in FIG. 11A, suction conveying tool 60 is made approximate frame-member-containing semiconductor wafer 10 so that wafer retention part 63 and frame member 14 vertically overlap (A in FIG. 11A). When plural suction parts 62 contact mask member 12 directly above frame member 14, air inside the vacuum pipe line is vacuum-suctioned by a vacuum source. Herewith, as shown in FIG. 11B, frame-member-containing semiconductor wafer 10 is sucked by plural suction parts 62 of suction conveying tool 60. Hence, by moving suction conveying tool 60 while retaining the state, frame-member-containing semiconductor wafer 10 can be moved to any position.

Figure 12:
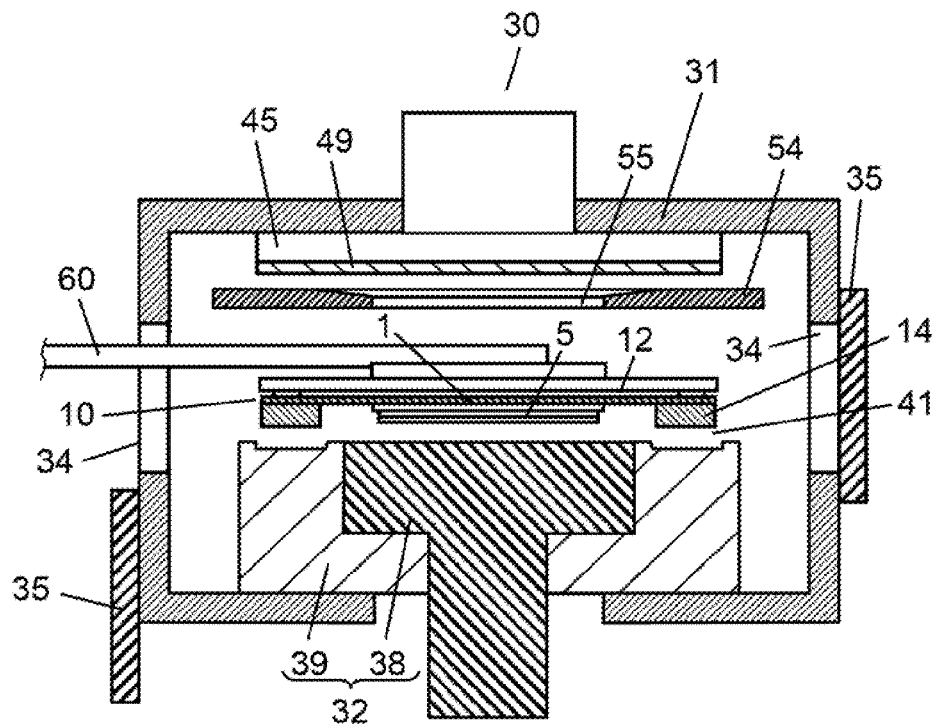
FIG. 12 is a sectional elevational view illustrating operation of the plasma dicing apparatus according to the embodiment.
Figure 13:
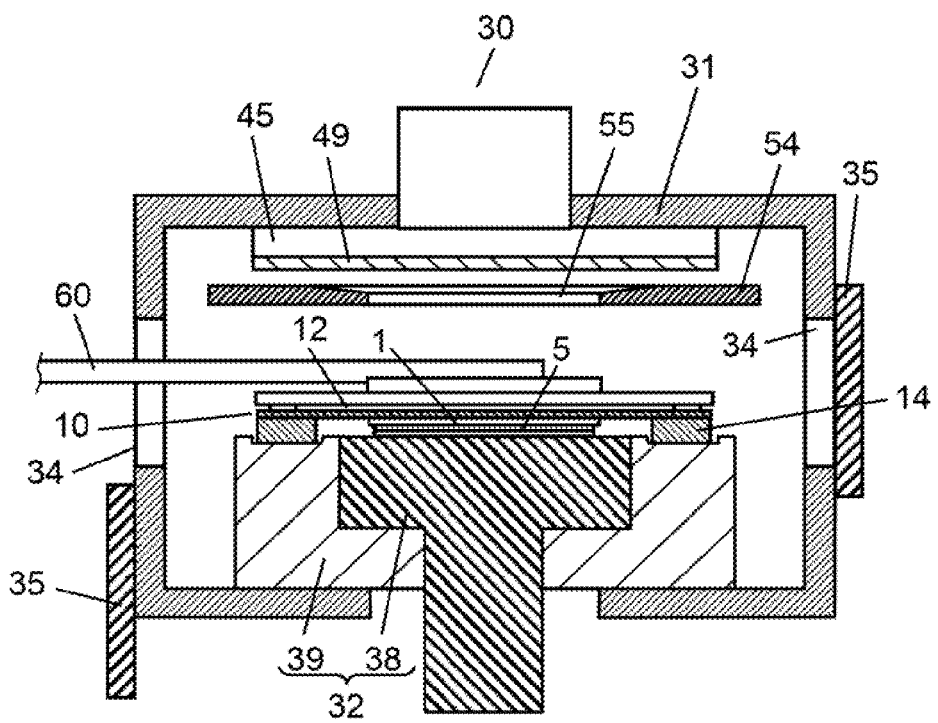
FIG. 13 is a sectional elevational view illustrating operation of the plasma dicing apparatus according to the embodiment.
Figure 14:
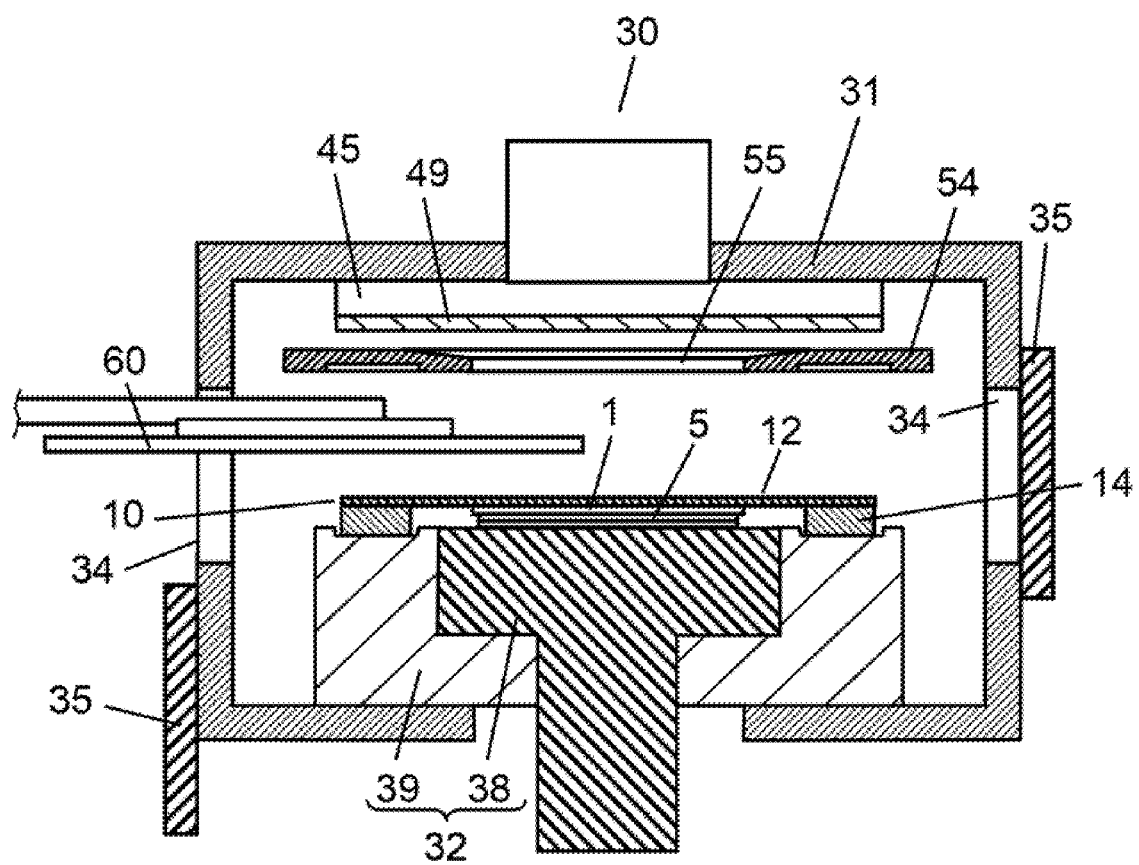
FIG. 14 is a sectional elevational view illustrating operation of the plasma dicing apparatus according to the embodiment.

FIGS. 12 through 14 are sectional elevational views of a plasma dicing apparatus for describing wafer carry-in step ST5 of the embodiment. In this step, controller 36 first exercises operation control on cover member elevation drive part 53 (FIG. 9) to move up piston rods 52 of two elevating cylinders 51 to the maximum protruded position and to position cover member 54 to the move-up position. When cover member 54 is positioned to the move-up position, suction conveying tool 60 sucks frame-member-containing semiconductor wafer 10 outside vacuum chamber 31. Herewith, controller 36 exercises operation control on gate open/close drive part 37 to move down one gate 35 of wafer gateway 34. When wafer gateway 34 opens with this operation, suction conveying tool 60 with frame-member-containing semiconductor wafer 10 sucked thereonto is inserted horizontally through wafer gateway 34 as shown in FIG. 12 to position frame-member-containing semiconductor wafer 10 to above stage 32. Then, suction conveying tool 60 is moved down so that frame member 14 of frame-member-containing semiconductor wafer 10 contacts groove 41 provided in frame member supporting part 39 of stage 32 from above, to release vacuum suction of suction conveying tool 60. Herewith, as shown in FIG. 13, frame member 14 of frame-member-containing semiconductor wafer 10 is in a state fitted into groove 41 of frame member supporting part 39. Herewith, semiconductor wafer 1 is in a state mounted on wafer supporting part 38.

Thus in carry-in step ST5, a part of frame member 14 of frame-member-containing semiconductor wafer 10 having undergone mask pattern forming step ST4 has only to be held and moved by suction conveying tool 60. Hence here also, mask member 12 retained by frame member 14 functions as a transfer carrier for semiconductor wafer 1.

Here, as described above, groove 41 provided in frame member supporting part 39 of stage 32 is provided at a position and in size so that frame member 14 of frame-member-containing semiconductor wafer 10 is fitted into groove 41 when frame-member-containing semiconductor wafer 10 is mounted on stage 32 so that the center of frame-member-containing semiconductor wafer 10 nearly conforms to the center of stage 32. Hence, as described above, with frame member 14 of frame-member-containing semiconductor wafer 10 fitted into groove 41 provided in frame member supporting part 39 of stage 32, frame-member-containing semiconductor wafer 10 can be mounted on stage 32 in a state where the center of frame-member-containing semiconductor wafer 10 (i.e. center of semiconductor wafer 1) nearly conforms vertically to the center of stage 32 (i.e. center of wafer supporting part 38).

After frame-member-containing semiconductor wafer 10 is mounted on stage 32, as shown in FIG. 14, suction conveying tool 60 is pulled outside vacuum chamber 31. Controller 36 exercises operation control on gate open/close drive part 37 to move up gate 35 of wafer gateway 34 currently opening to shut off wafer gateway 34. Herewith, the inside of vacuum chamber 31 becomes hermetically sealed.

After wafer gateway 34 is shut off, controller 36 exercises operation control on cover member elevation drive part 53 to move down cover member 54. Cover member 54 touches frame member 14 of frame-member-containing semiconductor wafer 10 mounted on stage 32 from above in the process of moving down and is positioned at the position (frame member touching position) touched. After cover member 54 touches frame member 14 from above and is positioned at the frame member touching position, cover member 54 is disconnected from piston rod 52, resulting in cover member 54 mounted on frame member 14. Herewith, frame member 14 is pressed on against stage 32 due to the self weight of cover member 54. That is, as shown in FIG. 7, frame member 14 is held between cover member 54 and stage 32 to be fixed onto stage 32 (onto frame member supporting part 39). In a state of cover member 54 thus positioned at the frame member touching position, frame member 14 of frame-member-containing semiconductor wafer 10 becomes covered from above with cover member 54 made of a dielectric substance. This process completes placing frame-member-containing semiconductor wafer 10 onto stage 32, thereby ending wafer carry-in step ST5.

(Boundary Groove Surface Smoothing Step ST6)

Figure 15A:
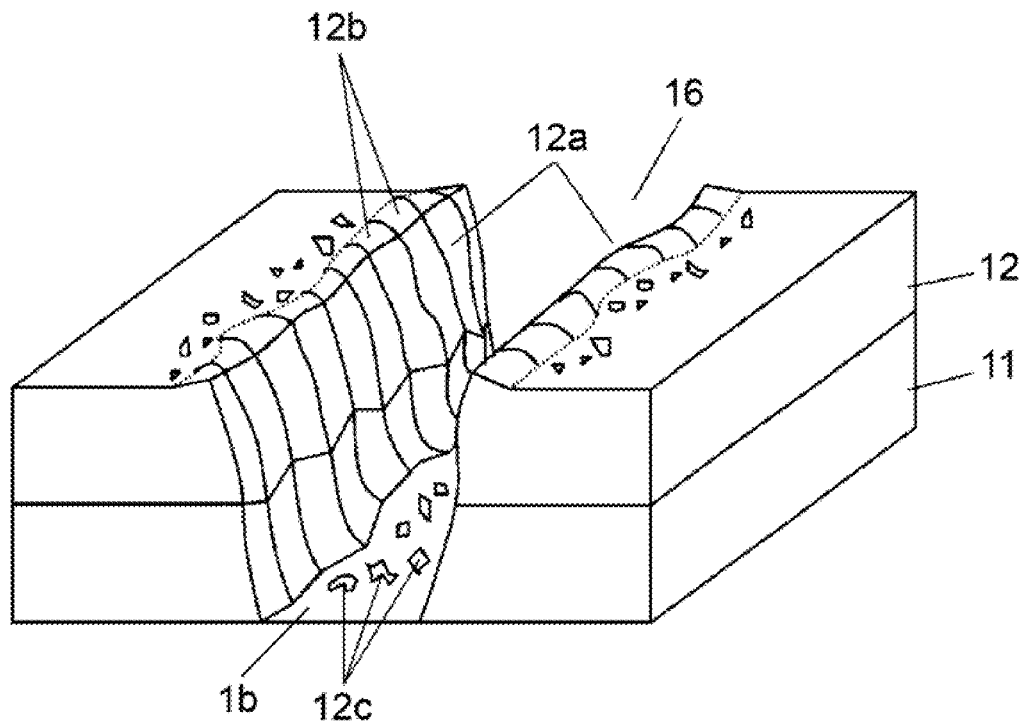
FIG. 15A is an enlarged perspective view of a boundary groove of a semiconductor chip in the embodiment.
Figure 15B:
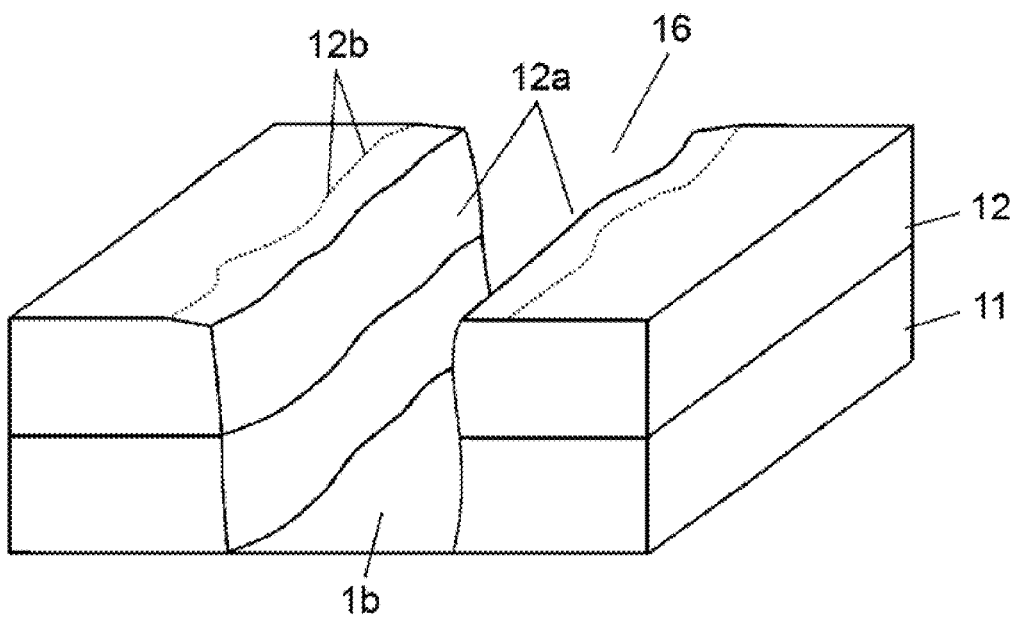
FIG. 15B is an enlarged perspective view of the boundary groove of the semiconductor chip in the embodiment.

FIGS. 15A, 15B are enlarged perspective views of a boundary groove of a semiconductor chip illustrating boundary groove surface smoothing step ST6 according to the embodiment. FIGS. 16A through 16D are process sectional views for illustrating boundary groove surface smoothing step ST6 and its subsequent plasma dicing step ST7 of a method of manufacturing semiconductor chips according to the embodiment.

After wafer carry-in step ST5 ends, boundary groove surface smoothing step ST6 is executed. The surface of boundary groove 16 of mask member 12 laser-processed in mask pattern forming step ST4 described above has a concave-convex shape jagged at an acute angle. Here, the surface of boundary groove 16 refers to the next two types of surfaces shown in FIG. 15A. The first type refers to two removal surfaces 12a of mask member 12 facing each other, produced by removing mask member 12 (and die attach film 11) by laser light 24. The second type refers to a surface composed of back surface 1b of semiconductor wafer 1 exposed in boundary groove 16 from between these two removal surfaces 12a.

The reason why the surface of boundary groove 16 becomes a jagged concave-convex shape is that mask member 12 has been removed by pulsating laser light 24 in mask pattern forming step ST4. The causes include the followings. That is, removing by pulsating laser light 24 causes asperity 12b to be generated on removal surface 12a of mask member 12. Residue 12c of mask member 12 shattered circumferentially when removing mask member 12 adheres to the surface of boundary groove 16.

If plasma etching is performed in plasma dicing apparatus 30 immediately from this state, the side surface of semiconductor chip 4 diced as well becomes jagged, facilitating generation of stress concentration there. For this reason, after semiconductor wafer 1 is carried into vacuum chamber 31 of plasma dicing apparatus 30, the surface of boundary groove 16 in a concave-convex shape in mask pattern forming step ST4 is smoothed before plasma etching is performed.

Figure 16A:
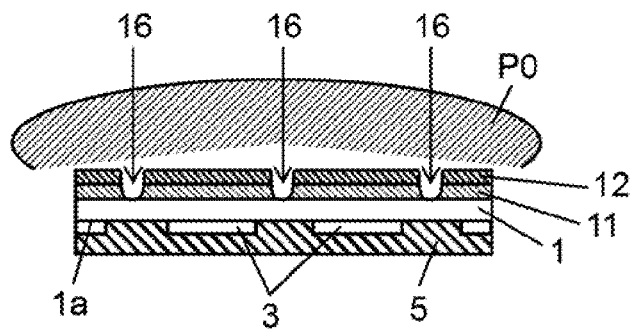
FIG. 16A is a manufacturing process sectional view showing a method of manufacturing semiconductor chips, according to the embodiment.
Figure 16B:
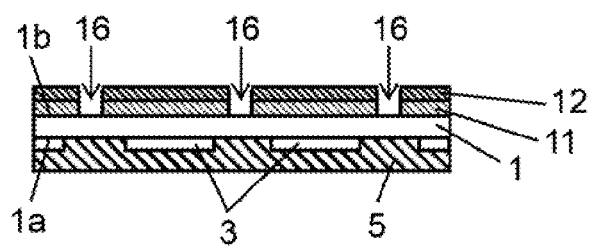
FIG. 16B is a manufacturing process sectional view showing the method of manufacturing semiconductor chips, according to the embodiment.

In boundary groove surface smoothing step ST6, controller 36 first exercises operation control on vacuum exhausting part 48 to evacuate the air inside vacuum chamber 31. Then, controller 36 controls process gas feeder 46 to make upper electrode 45 feed oxygen gas (or a mixed gas primarily containing oxygen gas). With this operation, oxygen gas is fed from upper electrode 45 into vacuum chamber 31 through porous plate 49. In this state, controller 36 controls high-frequency power supply unit 43 to apply a high-frequency voltage to wafer supporting part 38 as a lower electrode. Herewith, as shown in FIG. 16A, plasma Po of oxygen gas is generated between wafer supporting part 38 (lower electrode) and upper electrode 45. Plasma Po of oxygen gas ashes mask member 12 (and die attach film 11), which is organic matter, thereby smoothing the surface of boundary groove 16 as shown in FIGS. 15B, 16B.

Smoothing the surface of boundary groove 16 is performed in the following process concretely. That is, as shown in FIG. 15B, asperity 12b on the surface (two removal surfaces 12a of mask member 12 facing each other) of boundary groove 16 is removed by plasma Po of oxygen gas. Further, residue 12c of mask member 12 adhering to the surface of boundary groove 16 is removed. Then, asperity 12b on the surface (two removal surfaces 12a of mask member 12 facing each other) of boundary groove 16 is smoothed to increase the concave-convex cycle of asperity 12b. Here, while smoothing the surface of boundary groove 16 by plasma of oxygen gas, cooling unit 44 is driven to circulate a refrigerant in wafer supporting part 38, thereby preventing semiconductor wafer 1 from heating due to the heat of the plasma.

As mask member 12 is exposed in plasma Po of oxygen gas for longer duration, ashing of mask member 12 proceeds further. However, the duration of exposing mask member 12 in plasma Po of oxygen gas in boundary groove surface smoothing step ST6 is to be the minimum extent required for smoothing the surface of boundary groove 16. As a guide, the duration of exposure is preferably long enough to remove the outer surface of mask member 12 by approximately 1 to 3 μm.
(Plasma Dicing Step ST7)

Figure 16C:
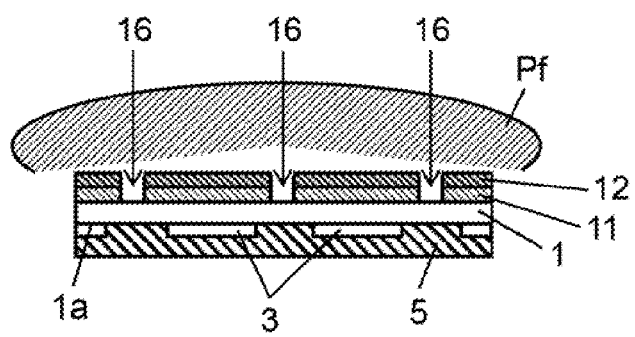
FIG. 16C is a manufacturing process sectional view showing the method of manufacturing semiconductor chips, according to the embodiment.

After boundary groove surface smoothing step ST6 ends, plasma dicing step ST7 is executed. In this step, controller 36 first controls process gas feeder 46 to make upper electrode 45 feed fluorine-containing gas. With this operation, fluorine-containing gas is fed from upper electrode 45 into vacuum chamber 31 through porous plate 49. In this state, controller 36 controls high-frequency power supply unit 43 to apply a high-frequency voltage to wafer supporting part 38 as a lower electrode. Herewith, as shown in FIG. 16C, plasma Pf of fluorine-containing gas is generated between wafer supporting part 38 (lower electrode) and upper electrode 45.

Figure 16D:
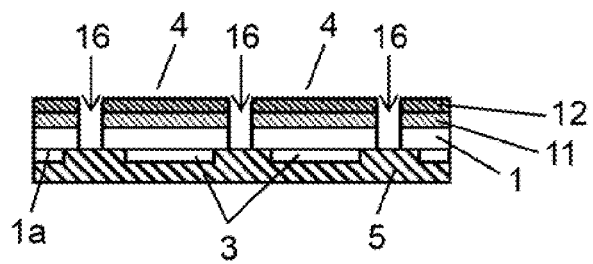
FIG. 16D is a manufacturing process sectional view showing the method of manufacturing semiconductor chips, according to the embodiment.

Plasma Pf of fluorine-containing gas generated plasma-etches back surface 1b of semiconductor wafer 1 made of silicon using mask member 12 with a mask pattern (boundary groove 16) formed therein as a mask. Hence, semiconductor wafer 1 is collectively cut off along boundary groove 16 (plasma dicing). Herewith, as shown in FIG. 16D, semiconductor wafer 1 is diced into individual semiconductor chips 4. Here, while etching back surface 1b of semiconductor wafer 1 by plasma Pf of fluorine-containing gas, controller 36 controls cooling unit 44 to circulate a refrigerant in wafer supporting part 38, thereby preventing semiconductor wafer 1 from heating due to the heat of the plasma.

Here, since the surface of boundary groove 16 has been smoothed in the previous step (boundary groove surface smoothing step ST6), the section (i.e. the side surface of semiconductor chip 4) of semiconductor wafer 1 formed by plasma etching is flat. Since plasma etching proceeds with boundary groove 16 as an origin, each semiconductor chip 4 diced has roughly the same size as that of die attach film 11 stuck to each semiconductor chip 4.

While this plasma dicing is being executed, frame member 14, made of metal for example, retaining the outer circumference of mask member 12 is covered with cover member 54 made of a dielectric substance from above, which prevents plasma generated in vacuum chamber 31 from concentrating on frame member 14.
(Wafer Carry-Out Step ST8)

FIGS. 17A through 17D are process sectional views of a semiconductor chip illustrating from wafer carry-out step ST8 to exfoliating step ST12 according to the embodiment.

After plasma dicing step ST7 ends, wafer carry-out step ST8 is executed. In this step, controller 36 first controls process gas feeder 46 to stop feeding the inside of vacuum chamber 31 with a process gas. After that, controller 36 exercises operation control on vacuum exhausting part 48 to break vacuum inside vacuum chamber 31. Then, controller 36 exercises operation control on cover member elevation drive part 53 to move up piston rods 62 of two elevating cylinder 51 to the maximum protruded position and to position cover member 54 at the move-up position. Subsequently, controller 36 opens gate 35 of one wafer gateway 34 to insert suction conveying tool 60 into vacuum chamber 31. After suction conveying tool 60 is inserted, suction conveying tool 60 is made suck frame-member-containing semiconductor wafer 10, in the same way as carrying semiconductor wafer 10 into vacuum chamber 31. After that, suction conveying tool 60 with frame-member-containing semiconductor wafer 10 sucked thereto is put out through wafer gateway 34 opening outside vacuum chamber 31, and controller 36 shuts off gate 35. Herewith, frame-member-containing semiconductor wafer 10 (semiconductor chips 4 diced are linked together by protective sheet 5) is carried out from the inside of vacuum chamber 31.

Thus in wafer carry-out step ST8, a part of frame member 14 has only to be held and moved by suction conveying tool 60. Here also, mask member 12 retained by frame member 14 functions as a transfer carrier for semiconductor wafer 1.
(Die Bonding Sheet Sticking Step ST9)

Figure 17A:
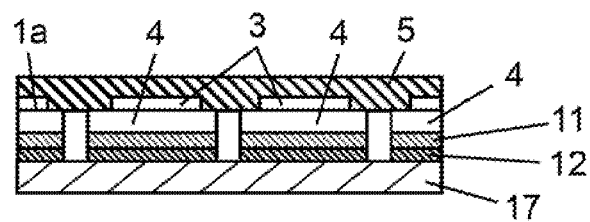
FIG. 17A is a manufacturing process sectional view showing the method of manufacturing semiconductor chips, according to the embodiment.

After wafer carry-out step ST8 thus ends, die bonding sheet sticking step ST9 is executed. In this step, as shown in FIG. 17A, frame-member-containing semiconductor wafer 10 is prepared so that the surface with protective sheet 5 stuck thereonto faces upward, and die bonding sheet 17 is stuck onto mask member 12 on the bottom surface. Die bonding sheet 17 is stuck so as to step over mask member 12 divided in mask pattern forming step ST4.

In die bonding sheet sticking step ST9, die bonding sheet 17 may have a size including frame member 14 so that the outer circumference of die bonding sheet 17 is retained by frame member 14, but not necessarily so. However, even in the latter case, at least all the mask members 12 divided in mask pattern forming step ST4 are preferably large enough to be linked by die bonding sheet 17.

In this die bonding sheet sticking step ST9, frame-member-containing semiconductor wafer 10 can be moved by holding a part of frame member 14. Hence here also, mask member 12 retained by frame member 14 functions as a transfer carrier for semiconductor wafer 1.
(Protective Sheet Removing Step ST10)

Figure 17B:
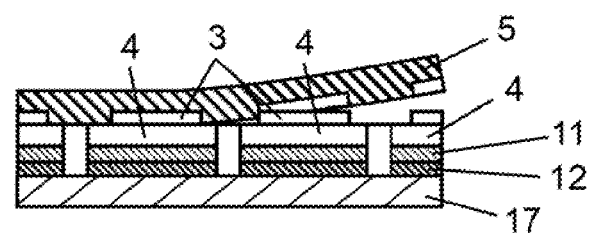
FIG. 17B is a manufacturing process sectional view showing the method of manufacturing semiconductor chips, according to the embodiment.

After die bonding sheet sticking step ST9 ends, protective sheet removing step ST10 is executed subsequently. In this step, as shown in FIG. 17B, protective sheet 5 is torn and removed off frame-member-containing semiconductor wafer 10 (semiconductor wafer 1 diced into individual semiconductor chips 4) with die bonding sheet 17 stuck thereto. Herewith, each semiconductor chip 4 has die attach film 11 with roughly the same size as the semiconductor chip 4 on the bottom surface (back surface 1b of semiconductor wafer 1) of the semiconductor chip 4. Each semiconductor chip 4 is in a state retained on the top surface of die bonding sheet 17 through die attach film 11, by an adhesive force between die attach film 11 and mask member 12; and between mask member 12 and die bonding sheet 17. In protective sheet removing step ST10, frame-member-containing semiconductor wafer 10 can be moved by holding a part of frame member 14. Hence here also, mask member 12 retained by frame member 14 functions as a transfer carrier for semiconductor wafer 1.
(Adhesive Force Deterioration Step ST11)

Figure 17C:
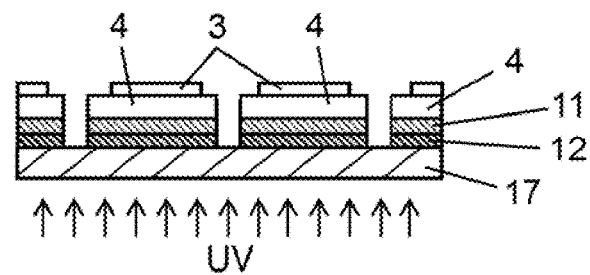
FIG. 17C is a manufacturing process sectional view showing the method of manufacturing semiconductor chips, according to the embodiment.

After protective sheet removing step ST10 ends, adhesive force deterioration step ST11 is executed. In this step, as shown in FIG. 17C, ultraviolet light is irradiated onto mask member 12 made of a UV tape to decrease an adhesive force between die attach film 11 and mask member 12. Adhesive force deterioration step ST11 weakens an adhesive force of mask member 12 to die attach film 11. Hence, each semiconductor chip 4 with die attach film 11 stuck onto its bottom surface can be easily exfoliated from die bonding sheet 17.
(Exfoliating Step ST12)

Figure 17D:
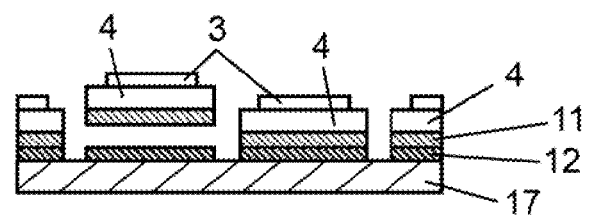
FIG. 17D is a manufacturing process sectional view showing the method of manufacturing semiconductor chips, according to the embodiment.

Here, as described above, when mask pattern forming step ST4 ends, mask member 12 and die attach film 11 are in a state divided for each area corresponding to each semiconductor chips 4. Accordingly, when protective sheet 5 is removed, and an adhesive force between die attach film 11 and mask member 12 decreases in adhesive force deterioration step ST11, semiconductor chip 4 with die attach film 11 stuck thereonto can be easily exfoliated from mask member 12 stuck onto die bonding sheet 17. Hence, if semiconductor chip 4 is pressed up from below die bonding sheet 17 by a pick-up mechanism (not shown), semiconductor chip 4 with die attach film 11 exfoliates from die bonding sheet 17 as shown in FIG. 17D. Semiconductor chip 4 exfoliated from die bonding sheet 17 is in a state where die attach film 11 (bonding film layer) is stuck to the bottom surface of semiconductor chip 4. Hence, picking up such semiconductor chip 4 allows itself to be directly bonded to a lead frame, board, and others.

As described hereinbefore, in the method of manufacturing semiconductor chips 4 according to the embodiment, semiconductor wafer 1 is in a state where mask member 12 retained by frame member 14 is stuck at least after masking step ST3 to die bonding sheet sticking step ST9. Consequently, mask member 12 retained by this frame member 14 is used as a transfer carrier for semiconductor wafer 1 and semiconductor chip 4 diced in plasma dicing step ST7. As a result, semiconductor wafer 1 can be handled very easily between each step. Here, mask member 12 is attached to back surface 1b of semiconductor wafer 1 after semiconductor wafer 1 undergoes thinning step ST2. Hence, frame member 14 does not interfere with grinding tool 8 in the thinning step as before, allowing an existing facility to be used in thinning step ST2.

In this embodiment, after plasma dicing step ST7, die bonding sheet 17 is stuck onto back surface 1b of semiconductor wafer 1 so as to step over mask member 12 divided in mask pattern forming step ST4. After that, protective sheet 5 is to be removed from semiconductor wafer 1 divided into individual semiconductor chips 4. As a result, at the time when protective sheet 5 is removed, semiconductor chip 4 is in a state where die bonding sheet 17 is stuck onto back surface 1b opposite to circuit-forming surface 1a. Hence, an existing facility can be used even in exfoliating step ST12. Further in this exfoliating step ST12, mask member 12 is left in a state stuck onto die bonding sheet 17. Hence, a step of removing mask member 12 from circuit-forming surface 1a of semiconductor chip 4 is not required after plasma dicing step ST7.

Here, in die bonding sheet sticking step ST9, if die bonding sheet 17 has a size including frame member 14 and is stuck onto semiconductor wafer 1 so that the outer circumference of die bonding sheet 17 is retained by frame member 14, when protective sheet 5 is removed from circuit-forming surface 1a of semiconductor wafer 1 in protective sheet removing step ST10 as shown in FIG. 17B, mask member 12 cease to function as a transfer carrier for semiconductor chip 4 at the time. Instead, die bonding sheet 17 is to act as a new transfer carrier for semiconductor chip 4. In die bonding sheet sticking step ST9, however, if die bonding sheet 17 does not have a size including frame member 14 and its outer circumference is not retained by frame member 14, mask member 12 retained by frame member 14 and die bonding sheet 17 stuck thereonto are to act as a new transfer carrier for semiconductor chip 4. In this case, mask member 12 is to be used as a transfer carrier for semiconductor chip 4 diced in bonding sheet sticking step ST9 and after as well.

In plasma dicing apparatus 30 according to the embodiment, the outer circumference of mask member 12 (etching-resistant, film-like) stuck onto back surface 1b opposite to circuit-forming surface 1a of semiconductor wafer 1 is retained by ring-shaped frame member 14. Vacuum chamber 31 is provided therein with frame member supporting part 39 supporting frame member 14, at the outer circumference of wafer supporting part 38 supporting semiconductor wafer 1. Consequently, semiconductor wafer 1 can be handled integrally with mask member 12 retained by frame member 14 in vacuum chamber 31 before and after plasma dicing step ST7. Consequently, when carrying semiconductor wafer 1 into and out of vacuum chamber 31, mask member 12 retained by frame member 14 can be made function as a transfer carrier for semiconductor wafer 1. This facilitates carrying semiconductor wafer 1 into and out of vacuum chamber 31 to improve workability.

Hereinbefore, the description is made of an embodiment of the present invention. However, the present invention is not limited to the above-described embodiment. For example, in the above-described embodiment, a UV tape is used as etching-resistant, film-like mask member 12 stuck onto the outer surface of die attach film 11. However, another matter other than a UV tape can be used such as a combination of a base made of a material resistant against plasma of fluorine-containing gas in a high-temperature environment, such as polyolefin resin and polyimide resin; and an adhesive whose adhesive force decreases by a simple method such as ultraviolet irradiation onto a UV tape.

INDUSTRIAL APPLICABILITY

The present invention facilitates carrying a semiconductor wafer into and out of a vacuum chamber to improve workability, and is useful such as for a plasma dicing apparatus manufacturing semiconductor chips.

The invention claimed is:
1. A method of manufacturing semiconductor chips by dicing a semiconductor wafer partitioned into a plurality of areas by a street, along the street, comprising:
   a protective sheet sticking step covering an entire circuit-forming surface of the semiconductor wafer;
   a thinning step thinning the semiconductor wafer by grinding a back surface opposite to the circuit-forming surface of the semiconductor wafer with the protective sheet stuck thereto;
   a masking step sticking an etching-resistant mask member onto the back surface of the semiconductor wafer ground in the thinning step;
   a mask pattern forming step forming a mask pattern on which the back surface of the semiconductor wafer corresponding to the street is exposed by removing a part of the mask member stuck to the back surface of the semiconductor wafer, corresponding to the street;
   a plasma dicing step performing plasma etching using the mask member on which the mask pattern is formed as a mask, and dicing the semiconductor wafer into the plurality of semiconductor chips;
   a die bonding sheet sticking step sticking a die bonding sheet onto the back surface of the semiconductor wafer diced into each of the semiconductor chips so as to step over the mask member with a part corresponding to the street removed in the mask pattern forming step after the plasma dicing step;
   a protective sheet removing step removing the protective sheet from the semiconductor wafer diced into each of the semiconductor chips after the die bonding sticking step;
   an exfoliating step exfoliating each of the semiconductor chips with the protective sheet removed from the mask member stuck onto the die bonding sheet,
wherein an outer circumference of the mask member extending off an outer circumference of the semiconductor wafer is retained by a ring-shaped frame member at least from after the masking step to the die bonding sheet sticking step, and wherein the mask member retained by the frame member is used as a transfer carrier for the semiconductor wafer and the semiconductor chips diced.

2. The method of manufacturing semiconductor chips of claim 1,
wherein, in the masking step, the mask member is stuck onto a back surface of the semiconductor wafer through a bonding film layer for die bonding,
wherein, in the mask pattern forming step, a part corresponding to the street, of the bonding film layer for die bonding is removed and divided for each area corresponding to each of the semiconductor chips, and
wherein, in the exfoliating step, each of the semiconductor chips is exfoliated from the mask member in a state bonded to the back surface of each of the semiconductor chips.

* * * * *